United States Patent [19]

Katz

[11] 4,112,364
[45] Sep. 5, 1978

[54] CIRCUIT BOARD TESTING APPARATUS
[75] Inventor: Jonathon H. Katz, Brookline, Mass.
[73] Assignee: Teradyne, Inc., Boston, Mass.
[21] Appl. No.: 784,266
[22] Filed: Apr. 4, 1977
[51] Int. Cl.² .................... G01R 31/02; G01R 15/12
[52] U.S. Cl. ............................. 324/158 F; 324/73 PC
[58] Field of Search ........... 324/158 F, 158 P, 73 AT, 324/73 PC, 72.5

[56] References Cited
U.S. PATENT DOCUMENTS
2,918,648  12/1959  Ludman et al. ................. 324/158 P OTHER PUBLICATIONS
Ormond, Jr.; "High-Temperature Multicontact Probe;" IBM Tech. Dis. Bull.; vol. 14; No. 2; Jul. 1971; p. 568.

Primary Examiner—Rudolph V. Rolinec
Assistant Examiner—Ernest F. Karlsen

[57] ABSTRACT

Circuit board testing apparatus featuring an improved weighting assembly for holding a circuit board in contact with test pins.

7 Claims, 11 Drawing Figures

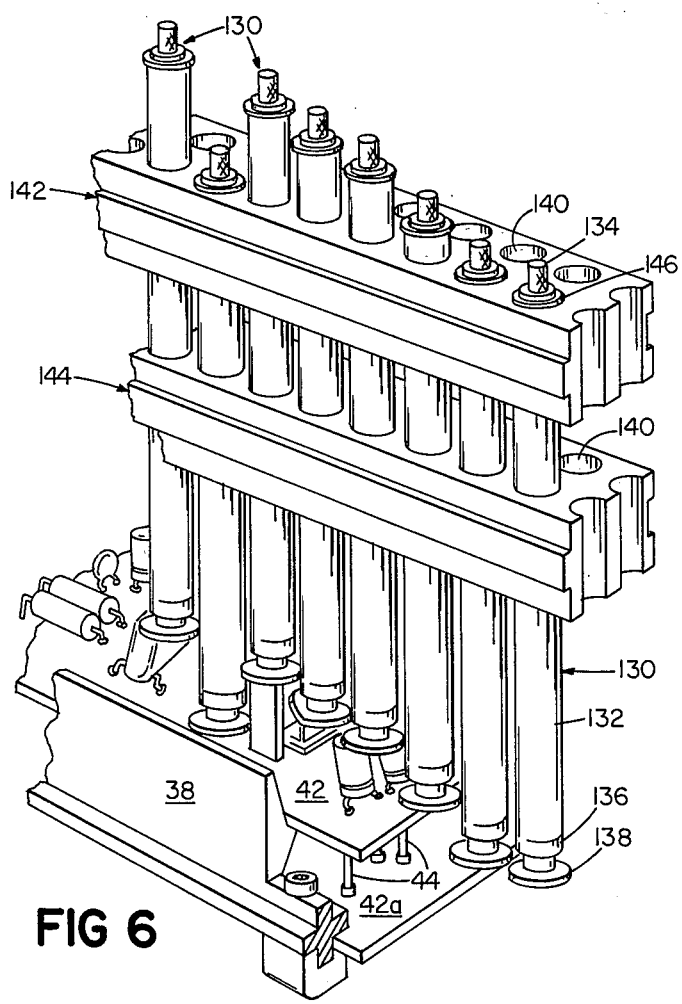
FIG 6
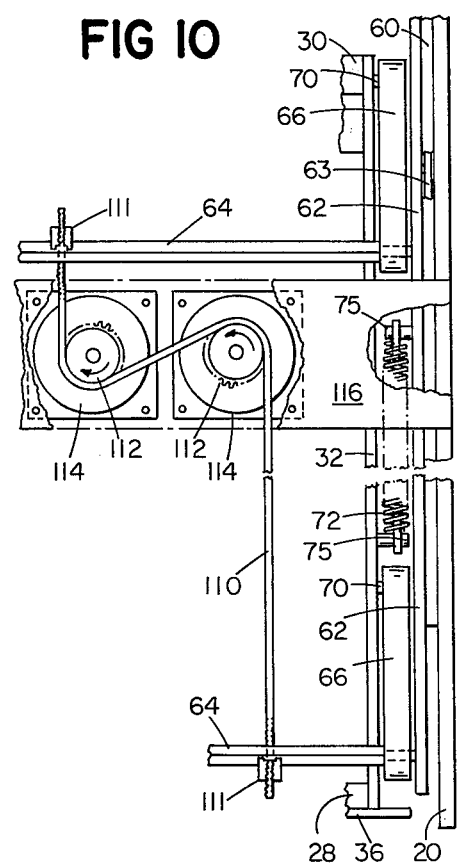
FIG 10
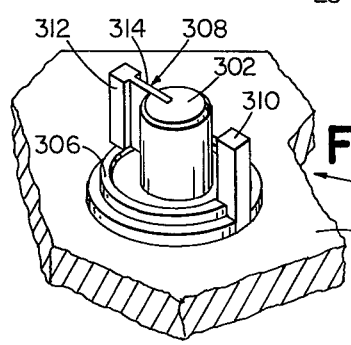
FIG 8
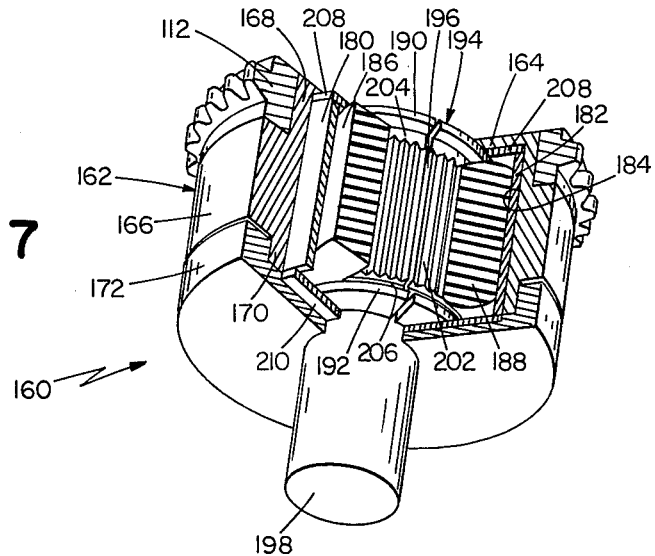
FIG 7
FIG 9

CIRCUIT BOARD TESTING APPARATUS

FIELD OF THE INVENTION

This invention relates to apparatus for the electrical testing of loaded circuit boards.

BACKGROUND OF THE INVENTION

A requirement of circuit board test apparatus is that the board to be tested must be held in electrical contact with test pins during the test cycle.

SUMMARY OF THE INVENTION

The invention features a novel weighting assembly with weights that are independently and freely vertically slideable in a frame and have tips for resting on a loaded circuit board to hold the board in electrical contact with test pins.

Other novel features, elements, aspects, and advantages and combinations thereof will be set forth hereinafter.

DESCRIPTION OF THE PREFERRED EMBODIMENT

I now turn to a description of a presently preferred embodiment of the invention.

DRAWINGS

FIG. 6 is an isometric fragmentary view of a portion of the weighting peg assembly contacting a loaded board;

FIG. 7 is an isometric view partially broken away and in section of a slip coupling;

FIGS. 8 and 9 are fragmentary isometric views of tools useful in assembling the slip coupling;

FIG. 10 is a fragmentary bottom plan view taken along 10—10 of FIG. 1; and

DESCRIPTION

Figure 1:
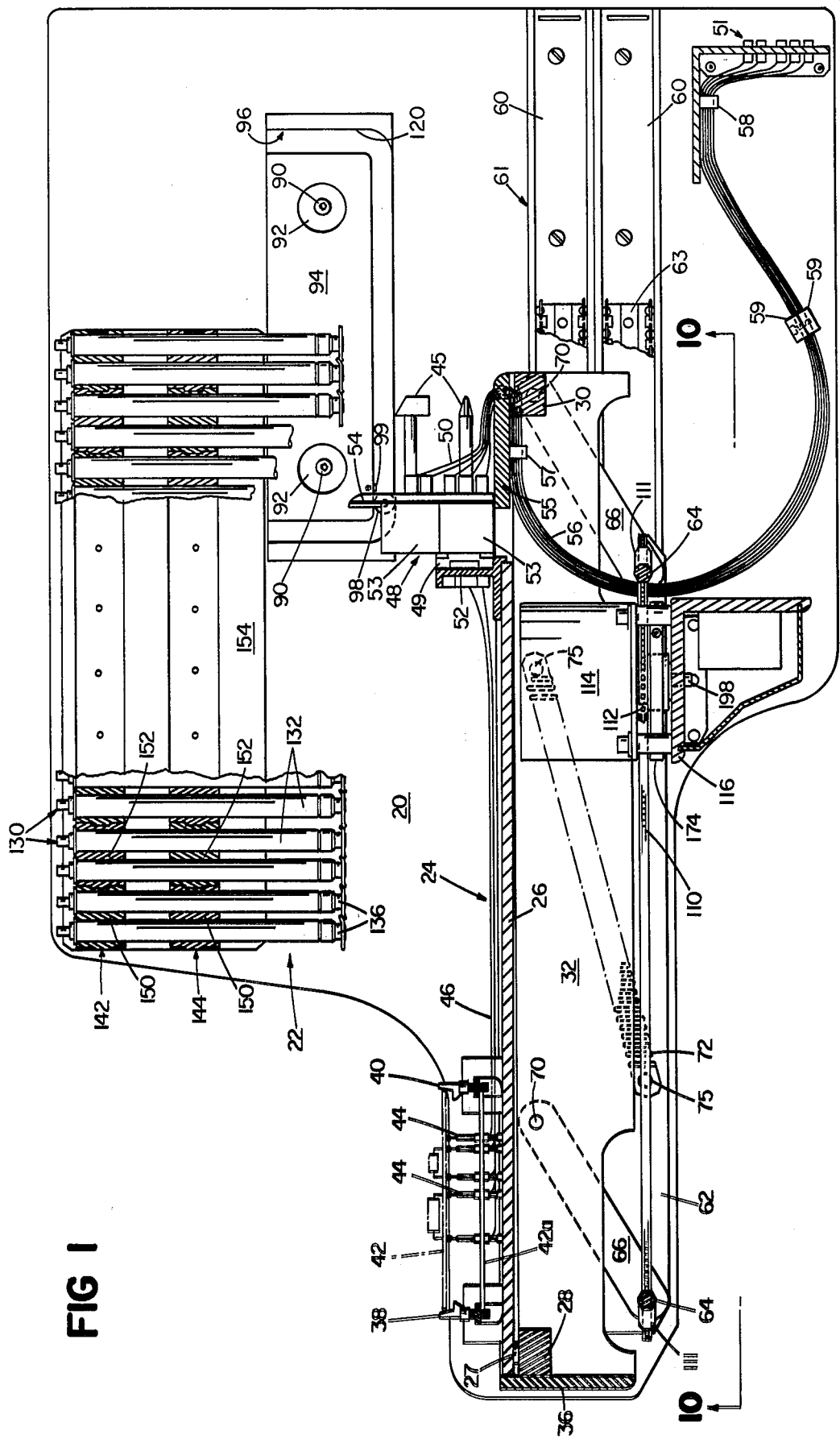
FIG. 1 is a vertical sectional view, partially broken away, of presently preferred printed circuit board testing apparatus embodying the invention.

The embodiment shown in the drawings and its operation are now described.

1. Embodiment

Referring to the drawings, the main frame of the device includes a pair of parallel side plates 20 between which are mounted weighting peg assembly 22 and, beneath the peg assembly, carrier assembly 24. Only one plate 20 (and only one of each of the other members provided in pairs on opposite sides of the device as described below) is shown in FIG. 1.

Figure 5:
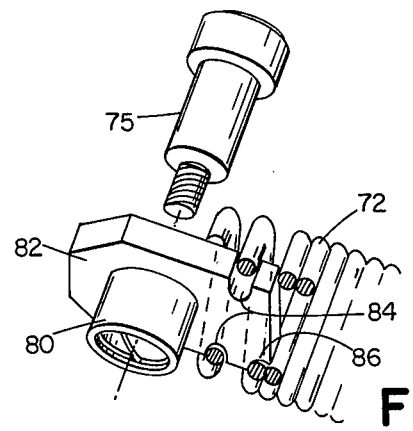
FIG. 5 is an isometric fragmentary partially exploded view of the pivoted end of a spring assembly used in the apparatus of FIG. 1.

On the inside of each side plate 20 is bolted the outer race 60 of a double ball slide 61. A slide plate 62 is bolted to the inner race 63 of each slide 61. Plates 62 are rigidly connected to each other by two hex rods 64. Four bar links 66 are provided, two connected between each slide plate 62 and a corresponding transversely inwardly adjacent carrier side frame 32. Side frames 32 are bolted to front bar 28 (outside which is secured front plate 36) and rear bar 30. Each link 66 is pivoted at one end on a cylindrical portion (not shown) of a hex rod 64 and at its other end on a pin 70 attached to a side frame 32. Washers (not shown) separate the links from the side frames. A coil spring 72 is also connected, in tension, between each side frame 32 and slide plate 62. Each spring connection is through a pin 75 (several holes, not shown, are provided in each slide plate for selection of spring tension) and a nylon lined steel collar 80 (FIG. 5) in an aluminum end piece 82 slotted on its side at 84 and relieved at 86 to receive portions of the spring on its final turn and a half, all to increase spring life. Links 66, slide plates 62, and side frames 32 constitute a four bar linkage for raising and lowering the test circuit board during its test cycle, as described below.

Fixture plate 26 is supported above front bar 28 on horizontally transversely outwardly extending shelf portions (not shown) of side frames 32. Rubber bumpers 27 on bar 28 prevent fixture plate 26 from wobbling. Cross bars 38 and 40 are mounted on plate 26. Loaded circuit board 42 to be tested rests on a set of electrical contact pins 44 mounted in a blank board 42a (as disclosed in detail in my copending patent application Ser. No. 757,778 incorporated herein by reference) supported between the cross bars. Cable assembly 46 with its wires connected to pins 44 extends along the fixture plate to plug assembly 48, and cables 50 extend from the plug assembly to outlet assembly 51. Shafts 45 are provided for adjusting plug assembly 48 to make the connections between the wires of cables 46 and 50 needed to test a given board 42.

In plug assembly 48 zero insertion force connector members 49 (one shown in FIG. 1) are mounted in rectangular openings of mounting panel 52 (as described in detail in my copending application entitled Testing Circuit Boards hereby incorporated by reference) in turn mounted on plate 26. Cable assembly 46 is also detailed in the copending application mentioned in the preceding sentence. Zero insertion force connector members 53 are mounted between vertical members 54 (one shown in FIG. 1) on shelf 55 in turn mounted on bar 30. In all there are eight connectors each consisting of a member 49 and a member 53, mounted side by side in two tiers. To facilitate connection of the members 49 and 53 without requiring critical alignment of the parts, the insides of the housings of the members 53 are slightly tapered.

Each cable 50 has a set of multi-strand silver coated copper wires arranged parallel to each other in a Teflon (Du Pont trademark) jacket. The cables 50 from each vertical pair of connector members 53 are gathered together with a nylon strip 56, pass under shelf 55 where they are strain relieved at 57, and follow a path which at first leads away from outlet assembly 51 but then loops around rear hex rod 64 (described below) downwardly and then gently up to assembly 51, where they are strain relieved at 58. Floating Delrin (Du Pont trademark) bars 59 are screwed to each other and have transversely spaced notches (not shown) to receive separately each bank of cables 50 with its respective strip 56. Strip 56 imparts some structural rigidity to the cables 50 and prevents their wear against hex rod 64. The cables 50 are all of the same length and begin and end in parallel planes. The overall arrangement allows free operation of the carrier assembly over many cycles with minimum stress on cables 50.

Also mounted on the inside of each side plate 20, by screws 90 in rubber washers 92 to provide a slightly flexible mount, is a member 94 with a generally U-shaped cam track 96. The U-shape allows a single item of inventory to be mounted on either side, and only one of the two vertical portions of each U is used in operation. A cam follower 98, supported for rotation by one member 54 extending up from shelf 31, runs in each track 96. A screw 99 provides a detent at the front of the horizontal portion of each track 96.

At each side of the carrier assembly a sprocket chain 110 (polyurethane over stainless steel, sold by W. M. Berg, Inc., East Rockaway, N.Y.) stretches between hex rods 64. Blocks 111 (FIGS. 1 and 10) are slotted to receive the ends of the chains 110 (which pass through holes in hex bars 64) and are shaped to fit against the hex rods. Each chain follows an S-shaped path around the sprocket wheels 112 of two oppositely rotating synchronous electric motors 114 (Superior Electric SS 50-1268). The motors, four in all, are mounted on shelf 116 supported by side plates 20.

Each weighting peg 130 (FIG. 2) has a cylindrical shaft 132 with a knurled knob 134 on its upper end and a rubber tip 136 on its other end. Tips 136 have enlarged circularly shaped lips 138 for contacting board 42. The pegs are mounted in rows of holes 140 (FIG. 3) in upper and lower plastic supports 142 and 144 separated by spacers 145, are free to slide up and down in the supports, and are prevented from dropping through holes 140 by compression type retaining washers 146 on the pegs just below knobs 134. The lips 138 of adjacent pegs overlap slightly to insure contact with all portions of loaded board 42 and to prevent components on the board from getting stuck between the pegs. Supports 142 and 144 consist of separate pieces, e.g., 150 and 152 (FIG. 4), having tongue-in-groove connections to each other and screwed at their ends to support plates 154 in turn mounted on side plates 20.

Each motor is coupled to its chain through a vibration absorbing slip coupling 60 (FIG. 1). Stainless steel outer coupling member 162 has an integral end cap 164 and a body 166 of annular cross-section with end portions 168 and 170 of reduced outside diameter on which are respectively pressed sprocket wheel 112 and separate end cap 172. Inner coupling members 180 and 182, each of semi-annular cross-section, are pressed into contact with the polished inside cylindrical surface 184 of body 166 by compressed Butyl rubber members 186 and 188 (also semi-annular in cross-section and with their transverse edges angularly aligned with the transverse edges of members 180 and 182, respectively) which are retained between end flanges 190 and 192 of stainless steel spool 194. Spool 194 is of generally annular cross-section and is slit radially at 196 to allow the sleeve to be expanded to fit over motor shaft 198 and then grip the shaft frictionally, as a spring. Sleeve 194 has knurls 202 to grip the rubber, and is relieved at 204 and 206 adjacent flanges 190 and 192 to provide space for excess rubber upon compression of members 186 and 188 during assembly. Teflon washers 208 and 210 reduce friction between end caps 164 and 172 and the inner members of the coupling; the large surface area of flanges 190 and 192 protects the washers from being cut into by the steel spool 194.

The large surface area of contact between the inner and outer coupling members provides high friction force and goes against the approach of using a high coefficient of friction material in the coupling; the inner members 180 and 182 are Delrin 100 (Du Pont trademark), durable enough to withstand many machine cycles, and with approximately equal static and dynamic coefficients of friction with steel surface 184.

Spool 194 is made by boring its axial hole to motor shaft diameter, cutting slit 196, compressing the spool to close the slit, and strain relieving the spool in its compressed state so that it must be expanded to fit on shaft 198.

Figure 2:
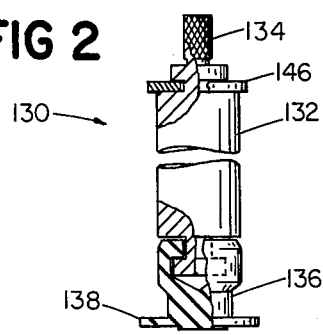
FIG. 2 is a side view partially in section and partially broken away of a weighting peg of the apparatus of FIG. 1.

FIG. 2 shows a jig 300 useful in assembling coupling 160. Cylindrical post 302, of diameter slightly less than that of the axial bore of spool 194 in the relaxed state of the spool, is mounted on base 304. Rim 306, of inside diameter slightly larger than the outside diameter of spool flanges 190 and 192, surrounds post 302, and extends above base 304 by slightly more than the thickness of flanges 190 and 192. Element 308 is of T-shaped cross-section and extends radially outwardly from post 302 on top of rim 306. Element 310 extends along base 304 radially outwardly from rim 306 at 180° to element 308, and has a width equal to that of the wide part 312 of element 308.

Figure 3:
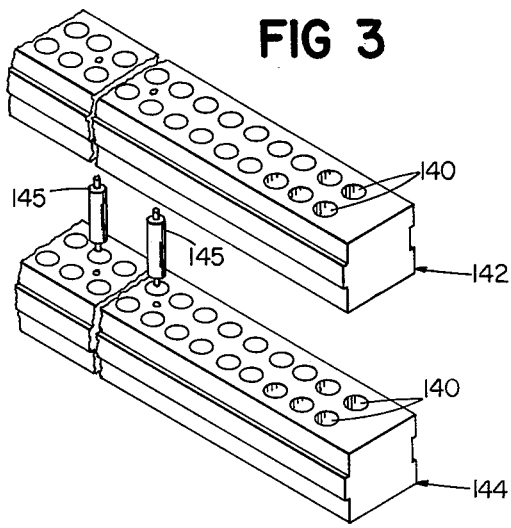
FIGS. 3 and 4 are fragmentary isometric views of portions of a weighting peg support frame.
Figure 4:
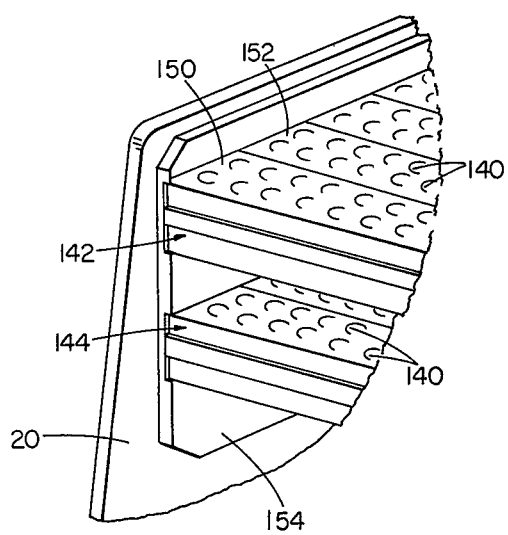

To assemble coupling 160, jig 307 is first lubricated with a Teflon spray. Spool 194 is slipped over post 302 with narrow part 314 of element 308 in slit 196. Butyl members 186 and 188 are placed on rim 306 with their concave surfaces in contact with the knurled surface of spool 194; members 186 and 188 are separated by elements 308 and 310. Delrin members 180 and 182 are placed on base 304 outside of rim 306, with their concave surfaces in contact with the convex surfaces of members 186 and 188, and are also separated by elements 308 and 310. The assembly thus far is lifted off jig 300 as a unit and transferred to tool 330 (FIG. 3).

Tool 330 has arms 332 and 334 hinged at 336. Opposing semi-cylindrical bores 338 and 340 are provided in arms 332 and 334, respectively, each with a counterbore 342, 344. The axial extent of bores 338 and 340 below the counterbores is equal to the axial dimension of spool 194. The common diameter of counterbores 342 and 344 is slightly larger than the outside diameter of end portion 170 of outer coupling member 166.

The assembly removed from jig 300 is placed in bores 338 and 340 and compressed by squeezing arms 332 and 334 together. End portion 170 of member 166 is placed in counterbores 342 and 344. The assembly is then turned over so that member 166 is on a table, and a suitable pusher is used to slide spool 194 and elements 180, 182, 186, and 188 into member 166.

The two motors 114 driving each chain 110 can be electrically connected in parallel for operation from a 120 volt supply, and in series for a 240 volt supply.

Figure 11:
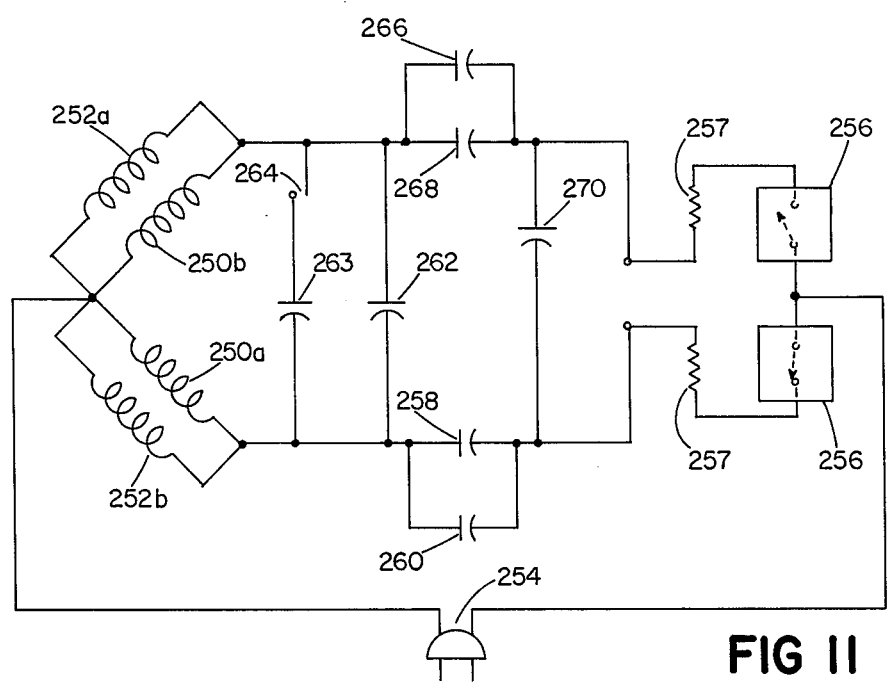
FIG. 11 is a circuit diagram of phase shift circuitry for driving synchronous motors.

FIG. 11 shows a phase shift network for the two motors 114 driving one chain 110; a duplicate of this circuitry is provided to drive the other two motors. The coils 250a and 252b and 252a and 250b of the two motors, respectively, are connected in parallel to receive power from 60 Hz, 120 volt source 254 for driving the motors in opposite directions. Two solid state switches 256 (each with a protective 2 ohm series resistor 257) combine to make up a SPDT switch for reversing the directions of the motors. Source 254 is connected across coils 250a and 252b through a parallel pair of 3.3 mfd capacitors 258 and 260. Source 254 is connected across coils 250b and 252a through two parallel paths, the first of which contains capacitors 258 and 260 in series with 1.0 mfd capacitor 262 (for 50 Hz power line operation additional 1 mfd capacitor 263 can be connected in parallel with capacitor 262 by switch 264), the second of which contains another parallel pair of 3.3 mfd capacitors 266 and 268 in series with 3.3 mfd capacitor 270. When the switches are reversed the power connections across the coils are simply reversed.

2. Operation

In operation, when motors 114 are on, sprocket wheels 112 draw chains 110, and with them the carrier side frames 32 and fixture plate 26, from left to right as seen in FIG. 1, moving cam followers 98 past detect screws 99 and along the horizontal portions of cam tracks 96. Springs 72 bias the carrier side frames 32 to the left relative to slide plates 62 (which are of course also moving horizontally), applying counterclockwise torque to bar links 66 which would tend to lift the frames 32 and fixture plate 26 were not the cam followers captured in their horizontal tracks. When the cam followers reach rearward vertical track portions 120 continued action of motors 114 causes the frames 32 and plate 62 to rise, and loaded board 42 is brought into resilient contact with weighting peg assembly 22. Springs 72 assist motors 114 somewhat in lifting the frames 32 and plate 26, with the assist being greatest at the lowest portion of plate 26, where the four bar linkage is most extended longitudinally and the motors thus have their least leverage advantage.

Rubber members 186 and 188 in coupling 162 have sufficient flexibility to allow about ±5° of rotation between spool 194 and inner coupling members 180 and 182 in response to vibrational loading forces, even if insufficient to cause the inner coupling members 180, 182 to slip along surface 184. This permits each motor to independently undergo the vibration necessary for start-up; and, furthermore, by absorbing vibration, reduces operating noise. The ability of the inner coupling members to slip along surface 184 in response to heavier loading provides for gradual acceleration when inertial forces might otherwise cause jerking and/or stalling of a motor, equalizes the loads on the motors, and allows the motors to run in phase with each other, and reduces machine noise in the even of a stall. The force fit of sleeve 194 and the motor shaft is sufficiently tight to lock the two parts rotationally under all loads up to and beyond the slip threshold of the coupling, and provides for overall compactness.

In each motor 114, one coil always receives current through 6.6 mfd of capacitance which, when the motor is at idle, boosts the voltage to about 50% above line, with a phase shift of about 40° relative to line. Current is supplied from the line to the second coil through 2.2 mfd of capacitance (the net of capacitors 266, 268, and 270), and combines with additional current bled off from the supply to the first coil and given an additional phase shift by the 1 mfd capacitance (2 mfd for 50 Hz) through which it passes. As a result, the net current supplied to the second coil is at a voltage which, at idle, is approximately equal in magnitude to, and yet (at about 135° relative to line phase) approximately 95° out of phase with, the voltage across the first coil. Under motor load the voltages change, but in the same direction and at approximately the same rate for each coil, so that at full load both coils receive about 150 volts and are thus operated at well above line voltage with resultant high power output. Further, the phase shifts change very little under motor load, so that at full load the relative phase shift is about 85°, still very close to the optimum 90° for synchronous motors. The absence of any substantial resistance in the phase shift network reduces electrical power dissipation (and resulting heat) and makes possible a physically compact circuit. Current drawn is very uniform. As selected, the capacitance values require the use of only two different size capacitors, and permit switching to 50 Hz operation by changing only one circuit value.

When loaded board 42 is brought into contact with tips 136 of the weighting pegs 130, the various pegs will slide up in their supports 142 and 144 by different amounts (FIG. 6), depending upon what part of the board the peg happens to contact. E.g., a peg in contact with a resistor will rise more than a peg in contact with a component-free area of the board. But each peg will apply the same downward force to the portion of the board it touches, the pegs thus as a group pressing the entire board into firm and uniform electrical contact with pins 44; lips 138 are thin and overlap only slightly, and thus have little effect upon the uniformity.

When the test has been completed switches 256 are reversed and the table assembly is returned to its original position.

Conclusion

Other embodiments are within the claims below.

Aspects of the circuitry and the slip coupling disclosed herein are claimed in my copending applications respectively entitled Phase Shift Circuit for Synchronous Motors, and Slip Coupling.

What is claimed herein is:

1. A circuit board test apparatus comprising; a weighting assembly having a frame and an array of weights mounted in said frame, each of said weights having a body portion mounted for independent free vertical sliding in said frame and a tip for contacting electrical elements loaded on said board and beneath said weights; and a multiplicity of test pins extending upwardly beneath said board; said weights being heavy enough to hold said board in electrical contact with said pins.

2. The apparatus of claim 1 which includes
   a carrier assembly having a support for positioning said circuit board above said test pins and
   a drive for causing relative vertical movement between said weighting assembly and said support while said weights are positioned directly above said board, said vertical movement being over a sufficient distance to bring said tips into contact with said elements on said board and to raise said weights in said frame.

3. The apparatus of claim 2 wherein each said tip is of rubbery material, and has a thin lip overlapping and adjacent said lip, said array including a multiplicity of spaced rows of said weights.

4. The apparatus of claim 2 wherein said carrier assembly comprises
   a fixture plate carrying said support,
     said fixture plate being mounted for horizontal movement between a retracted position and a forward position in which said board is directly beneath said weights, and
   means to lift said fixture plate from said forward position through said vertical movement.

5. The apparatus of claim 4 wherein said carrier assembly further comprises a stationary track and a follower member positioned in said track and mounted for movement with said fixture plate, said track having a horizontal portion extending along the path covered by said follower during said horizontal movement of said fixture plate, and a vertical portion extending along the path covered by said follower during said vertical movement of said fixture plate.

6. The apparatus of claim 4 wherein said carrier assembly comprises a pair of slide plates mounted for horizontal movement, a carrier support on which said fixture plate is mounted, links pivoted at their opposite ends to a said slide plate and said carrier support, respectively, and a spring having its opposite ends connected between a said slide plate and said carrier support to provide a force tending to pivot said links to lift said fixture plate.

7. The apparatus of claim 4 further comprising a cable assembly including a plug assemby mounted for movement with said fixture plate, a fixed terminal, and electrical cables extending between said plug assembly and said terminal, said cables following a curved path which, beginning at said plug assembly, leads away from said terminal before looping around to said terminal.

* * * * *